United States Patent
Tajima et al.

(10) Patent No.: US 11,563,238 B2
(45) Date of Patent: Jan. 24, 2023

(54) CHARGING-CONTROL DEVICE AND ELECTRONIC DEVICE WITH SECONDARY BATTERY

(71) Applicant: SEMICONDUCTOR ENERGY LABORATORY CO., LTD., Atsugi (JP)

(72) Inventors: Ryota Tajima, Kanagawa (JP); Toshiyuki Isa, Kanagawa (JP); Akihiro Chida, Kanagawa (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 219 days.

(21) Appl. No.: 16/767,637

(22) PCT Filed: Nov. 30, 2018

(86) PCT No.: PCT/IB2018/059485
§ 371 (c)(1),
(2) Date: May 28, 2020

(87) PCT Pub. No.: WO2019/116145
PCT Pub. Date: Jun. 20, 2019

(65) Prior Publication Data
US 2021/0005939 A1    Jan. 7, 2021

(30) Foreign Application Priority Data
Dec. 11, 2017    (JP) .............................. JP2017-236608

(51) Int. Cl.
*H01M 10/42*   (2006.01)
*G01R 31/367*  (2019.01)
*B60L 58/18*   (2019.01)

(52) U.S. Cl.
CPC ......... *H01M 10/4235* (2013.01); *B60L 58/18* (2019.02); *G01R 31/367* (2019.01);
(Continued)

(58) Field of Classification Search
CPC ......... H01M 10/4235; H01M 10/4257; H01M 2010/4271; G01R 31/367; B60L 58/18
(Continued)

(56) References Cited

U.S. PATENT DOCUMENTS 9,658,289 B2    5/2017 Arai et al.
10,283,820 B2   5/2019 Sugeno et al.
(Continued)

FOREIGN PATENT DOCUMENTS

CN    104614632 A    5/2015
CN    107329088 A    11/2017
(Continued)

OTHER PUBLICATIONS

International Search Report (Application No. PCT/IB2018/059485) dated Feb. 19, 2019.
(Continued)

*Primary Examiner* — James M Erwin
(74) *Attorney, Agent, or Firm* — Nixon Peabody LLP; Jeffrey L. Costellia

(57) ABSTRACT

A highly safe power storage system is provided. If n (n is an integer over or equal to three) secondary batteries are used in a vehicle such as an electric vehicle, a circuit configuration is used with which the condition of each secondary battery is monitored using an anomaly detection unit; and if an anomaly such as a micro-short circuit is detected, only the detected anomalous secondary battery is electrically separated from the charging system or the discharging system. At least one microcomputer monitors anomalies in n secondary batteries consecutively, selects the anomalous secondary (Continued)

battery or the detected secondary battery which causes an anomaly, and gives an instruction to bypass the secondary battery with each switch.

6 Claims, 14 Drawing Sheets

(52) U.S. Cl.
CPC .................. *H01M 10/4257* (2013.01); *H01M 2010/4271* (2013.01); *H01M 2220/20* (2013.01)

(58) Field of Classification Search
USPC .......................................................... 429/90
See application file for complete search history.

(56) References Cited

U.S. PATENT DOCUMENTS

| | | |
|---|---|---|
| 2004/0207367 A1 | 10/2004 | Taniguchi et al. |
| 2006/0181245 A1 | 8/2006 | Mizuno et al. |
| 2011/0148424 A1 | 6/2011 | Chiang et al. |
| 2015/0301122 A1 | 10/2015 | Lee |
| 2015/0318724 A1* | 11/2015 | Brockman ........... G01R 31/382 320/152 |
| 2016/0239592 A1 | 8/2016 | Pourmousavi Kani |

FOREIGN PATENT DOCUMENTS

| | | |
|---|---|---|
| EP | 1469321 A | 10/2004 |
| EP | 2916422 A | 9/2015 |
| EP | 3319203 A | 5/2018 |
| JP | 2000-354333 A | 12/2000 |
| JP | 2004-333472 A | 11/2004 |
| JP | 2013-172552 A | 9/2013 |
| JP | 2015-059933 A | 3/2015 |
| JP | 2015-166710 A | 9/2015 |
| WO | WO-2017/002292 | 1/2017 |
| WO | WO-2017096464 A1 * | 6/2017 .......... H01M 10/425 |

OTHER PUBLICATIONS

Written Opinion (Application No. PCT/IB2018/059485) dated Feb. 19, 2019.

* cited by examiner

When the first, the second, and the third secondary batteries are determined as normal:

When only the second secondary battery 301b is determined as anomalous:

2001

2100

2002

2101

2003

2102

2103

CHARGING-CONTROL DEVICE AND ELECTRONIC DEVICE WITH SECONDARY BATTERY

TECHNICAL FIELD

One embodiment of the present invention relates to an object, a method, or a manufacturing method. Alternatively, the present invention relates to a process, a machine, manufacture, or a composition (a composition of matter). One embodiment of the present invention relates to a manufacturing method of a semiconductor device, a display device, a light-emitting device, a power storage device, a lighting device, or an electronic device. In particular, one embodiment of the present invention relates to an electronic device including a charging system and a secondary battery.

Note that in this specification, a power storage device refers to every element and device having a function of storing power. Examples of the power storage device include a storage battery (also referred to as a secondary battery) such as a lithium-ion secondary battery, a lithium-ion capacitor, an all-solid-state battery, and an electric double layer capacitor.

BACKGROUND ART

In recent years, a variety of power storage devices such as lithium-ion secondary batteries, lithium-ion capacitors, and air batteries have been actively developed. In particular, demand for lithium-ion secondary batteries, which have high output and high energy density, has rapidly grown with the development of the semiconductor industry for portable information terminals such as mobile phones, smartphones, tablets, and laptop computers; portable music players; digital cameras; medical equipment; next-generation clean energy vehicles such as hybrid electric vehicles (HEV), electric vehicles (EV), and plug-in hybrid electric vehicles (PHEV); and the like. Lithium-ion secondary batteries are essential as rechargeable energy supply sources for today's information society.

In a portable information terminal, an electric vehicle, or the like, a plurality of secondary batteries connected in series or in parallel and provided with a protective circuit is used as a battery pack (also referred to as an assembled battery). A battery pack means a container (e.g., a metal can or a film exterior body) in which a battery module composed of a plurality of secondary batteries and a predetermined circuit are contained for easy handling of secondary batteries. The battery pack has an ECU (Electronic Control Unit) in order to manage the operation state. If each of a plurality of secondary batteries constituting a battery pack (an assembled battery) has different characteristics, the balance is disturbed. If the balance is disturbed, a secondary battery is excessively charged or not fully charged in a charging period; thus, the apparent capacity declines as a whole.

One battery pack, that is, a plurality of secondary batteries is collectively charged and discharged, which makes the balance more disturbed in one battery pack; life of a battery pack becomes shorter and shorter as charging and discharging are repeated.

Electric vehicles are vehicles in which only an electric motor is used for a driving portion, and hybrid vehicles are vehicles having both an internal-combustion engine such as an engine and an electric motor. A plurality of secondary batteries provided for vehicles is included in a battery pack, and a plurality of the battery packs is provided on the bottom of a vehicle.

Charging facilities or a household power supply is a power source to charge an electric vehicle or a hybrid electric vehicle. The time taken to reach full charge of batteries depends on specifications of charging facilities, that is, charging conditions such as a charging voltage; thus, it is difficult to estimate the finishing time of charging.

The secondary battery used in an electric vehicle or a hybrid electric vehicle degrades due to the number of charging, the depth of discharge, charging currents, charging environment (temperature change), or the like. The degradation also depends on the usage of the user; and charging temperatures, frequency of quick charging, charging amount with a regenerative brake, charging timing with a regenerative brake, and the like might relate to the degradation.

Patent Document 1 shows an example where a neural network is used for calculating the remaining capacity of a storage battery.

REFERENCE

Patent Document

[Patent Document 1] United States Published Patent Application No. 2006/0181245

SUMMARY OF THE INVENTIONS

Problems to be Solved by the Invention

An object of one embodiment of the present invention is to provide a highly safe power storage system. Another object of one embodiment of the present invention is to provide a vehicle including a power storage system with excellent characteristics. Another object of one embodiment of the present invention is to provide an electronic device including a power storage system with excellent characteristics.

Means for Solving the Problems

If n (n is an integer over or equal to three) secondary batteries are used in a vehicle such as an electric vehicle, a circuit configuration is used with which the condition of each secondary battery is monitored using an anomaly detection unit; and if an anomaly such as a micro-short circuit is detected, only the detected anomalous secondary battery is electrically separated from the charging system or the discharging system.

The micro-short circuit refers to a minute short circuit in a secondary battery caused by a short circuit of a positive electrode and a negative electrode of the secondary battery, which does not make charging and discharging impossible, but a small amount of short-circuit-current passes through a minute short circuit part. A cause of the micro-short circuit is a plurality of charging and discharging operations, which makes positive electrode active materials unevenly distributed; then the concentration of current occurs locally in part of the positive electrode and the negative electrode; and then part of a separator does not function or a by-product is generated by a side reaction; thus a minute short circuit is thought to be caused.

A thinner separator to make a secondary battery smaller and quick electric power supply at a high voltage are desired for an ideal secondary battery; both of them have configurations to suffer a micro-short circuit easily. Repetition of micro-short circuits may cause a secondary battery to generate unusual heat and may lead to severe accidents such as a fire.

Thus, a neural network is used for anomaly detection of a secondary battery to configure a power storage system or a control system of a secondary battery, which detects a micro-short circuit in its early stage and prevents severe accidents beforehand. The neural network is called an artificial neural network, which is a kind of a machine learning technique.

A structure disclosed in this specification is a charging control device including a first secondary battery, a second secondary battery, and a third secondary battery, which are connected in series; and at least one switch which cuts off electric power supply from one terminal of the first secondary battery to one terminal of the second secondary battery. The one terminal of the first secondary battery is connected in series to the third secondary battery with the use of a wire bypassing the one terminal of the second secondary battery and through the action of switching of the switch so that the second secondary battery is not charged.

The above structure further includes a second switch between the other terminal of the second secondary battery and one terminal of the third secondary battery; the one terminal of the first secondary battery brings the third secondary battery into an uncharged state with the use of a wire bypassing the one terminal of the third secondary battery and through the action of switching of the second switch.

In the above structure, the switch is not a switch with a physical lever or a service plug, but an element controlling on and off with an electric signal (such as a power MOSFET).

At least one microcomputer can decide whether the switch is switched: the microcomputer monitors anomalies in n secondary batteries consecutively, selects the anomalous secondary battery or the detected secondary battery which causes an anomaly, and gives an instruction to bypass the secondary battery with each switch.

A microcomputer monitoring anomalies including a micro-short circuit between a positive electrode and a negative electrode of a secondary battery and controlling switching of the switch is referred to as an anomaly-monitoring unit.

The anomaly-monitoring unit analyzes the state of a storage battery by measuring parameters such as the voltage and the current, for example, during a charging and discharging process of the storage battery. More specifically, a charge curve and a discharge curve are analyzed, for example. The charge curve shows, for example, a transition of a voltage or a capacity over time during a charging process. The discharge curve shows, for example, a transition of a voltage or a capacity over time during a discharging process.

A secondary battery detected as anomalous is switched off not to be used. If the secondary battery detected as anomalous is one of secondary batteries connected in series, switching off the switch makes a circuit bypass the secondary battery (also referred to as a bypass circuit). Controlling of switching of the switch is based on an electric signal formed by a controlling unit, in particular, a microcomputer and the like.

An electric vehicle is provided with a high-voltage power supply and a low-voltage power supply; the high-voltage power supply is composed of n secondary batteries in series-parallel and parallel-series; and the power is supplied of to the anomaly-monitoring unit by the low-voltage power supply.

In the above structure, the microcomputer can make inference using a neural network.

In this specification, a neural network refers to a general model that is modeled on a biological neural network, determines the connection strength of neurons by learning, and has the capability of solving problems. A neural network includes an input layer, a middle layer (also referred to as a hidden layer), and an output layer.

In describing a neural network in this specification, to determine a connection strength (also referred to as a weight coefficient) between neurons from existing information is sometimes referred to as "learning".

Moreover, in this specification, to draw a new conclusion from a neural network formed using a connection strength obtained by learning is sometimes referred to as inference.

As a neural network, a configuration called long short-term memory (LSTM) can be used. In LSTM, a hidden layer stores a state with a memory cell in RNN, and analysis, such as prediction, on a longer period of time can be performed. In LSTM, an estimation program is prepared with an adder (Add), a sigmoid function, tanh, Hadamard product, and the like which are set properly, in addition to multiply-accumulate operation (MAC). A variety of programing languages such as Python, Go, Perl, Ruby, Prolog, Visual Basic, C, C++, Swift, Java (registered trademark), and NET can be used for the program of the software executing an estimation program. The application may be designed using a framework such as Chainer (it can be used with Python), Caffe (it can be used with Python and C++), and TensorFlow (it can be used with C, C++, and Python). For example, the algorithm of the LSTM is programmed with Python, and a CPU (Central Processing Unit) or a GPU (Graphics Processing Unit) is used. Furthermore, a chip in which a CPU and a GPU are integrated is sometimes called an APU (Accelerated Processing Unit), and this APU chip can also be used. An IC with an AI system (also referred to as an inference chip) can be used. An IC with an AI system is referred to as a circuit performing neural network calculation (also referred to as a microprocessor) in some cases.

This specification shows an example in which secondary batteries are contained in a charging control device, but it is not limited thereto, alternatively, secondary batteries may be contained in a battery holder or a battery box so that they can be replaced. In this case, the charging control device is composed of a plurality of battery holders connected in series, and switches and an anomaly detection unit are connected to terminals of the battery holders.

Another structure disclosed in this specification is a charging control device including a first secondary battery holder, a second secondary battery holder, and a third secondary battery holder, which are connected in series; and at least one switch which cuts off electric power supply from one terminal of the first secondary battery holder to one terminal of the second secondary battery holder. The one terminal of the first secondary battery holder is connected in series to the third secondary battery holder with the use of a wire bypassing the one terminal of the second secondary battery holder and through the action of switching of the switch so that electric power is not supplied to the second secondary battery holder.

Effect of the Invention

One embodiment of the present invention can provide a highly safe power storage system.

Safety can be secured by detection of the secondary battery which has an anomaly such as a micro-short circuit with a neural network and by avoidance of the usage of the secondary battery by switching of a switch. Danger caused from using an anomalous secondary battery continuously and negative effects on other secondary batteries can be avoided.

If 100 or more secondary batteries are used in a vehicle such as an electric vehicle, it is possible to count the number of secondary batteries which are switched off and not used due to degradation, and based on the number of the secondary batteries, it is possible to decide when the whole secondary batteries (a battery module) are replaced. It is conventionally decided based on the usage period used or the cycle number in many cases; thus the whole secondary batteries are replaced for safety though they are still usable.

One embodiment of the present invention can provide a vehicle including a power storage system having excellent characteristics.

If 100 or more secondary batteries are used in a vehicle such as an electric vehicle, the degree of degradation of each battery varies as the charging cycles are increased, and the secondary batteries have different voltages in fully charged states. If each secondary battery is provided with a switch, the amount of charging can be increased through stopping charging the secondary battery which is regarded as anomalous because of a low voltage due to degradation by switching of the switch. If some batteries become empty after the electric vehicle drives, the secondary batteries of the low amount of charge are switched off and not used; this makes the other secondary batteries usable to continue driving.

One embodiment of the present invention is not limited to vehicles and an electronic device including a plurality of secondary batteries and a power storage system having excellent characteristics can be provided.

MODE FOR CARRYING OUT THE INVENTION

Hereinafter, embodiments of the present invention will be described in detail using the diagrams. Note that the present invention is not limited to the description below, and it is easily understood by those skilled in the art that modes and details of the present invention can be modified in various ways. In addition, the present invention should not be construed as being limited to the description in the following embodiments.

Embodiment 1

In this embodiment, an example is shown applying a charging control device to an electric vehicle (EV) with FIG. 1.

Figure 1A:
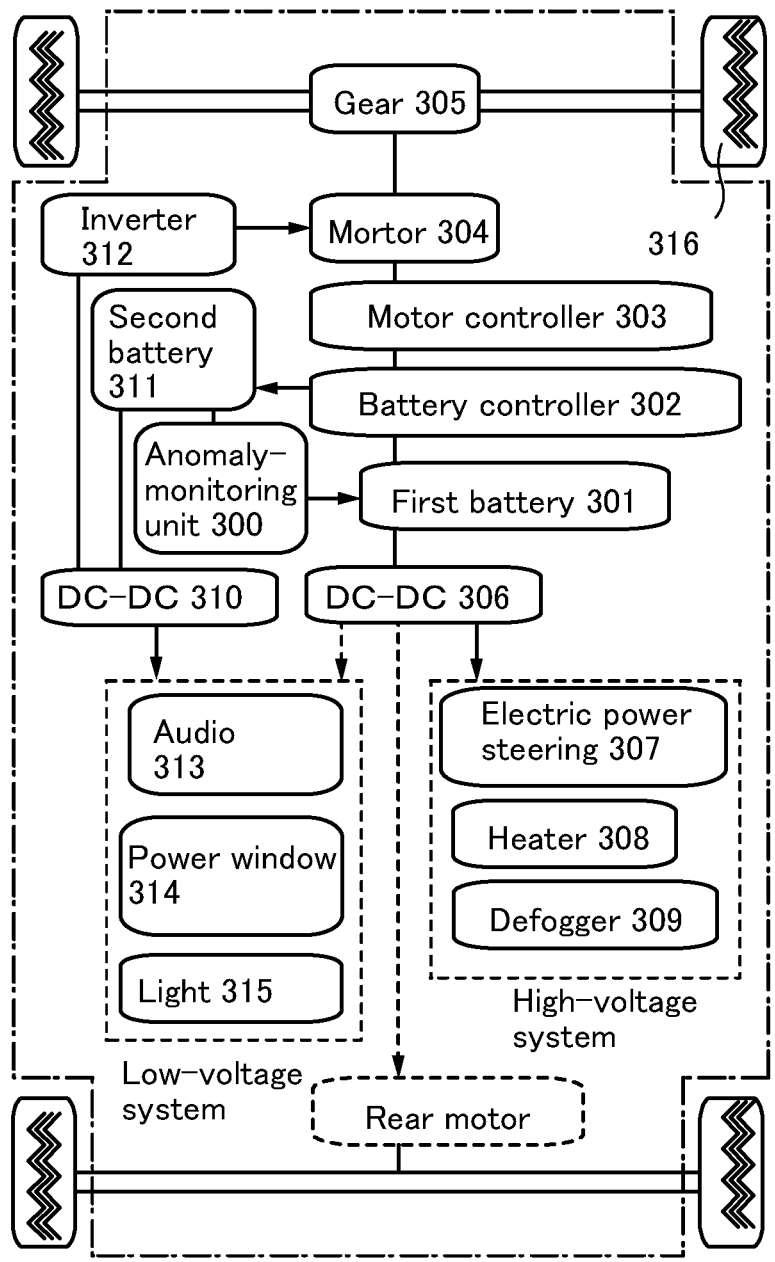
FIG. 1 A block diagram and a perspective view of one embodiment of the present invention.

FIG. 1(A) shows an example of a block diagram of an electric vehicle.

In an electric vehicle, a first battery 301 as a main-driving secondary battery and a second battery 311 which supplies electric power to an inverter 312 starting a motor 304 are provided. In this embodiment, an anomaly-monitoring unit 300 driven by electric power from the second battery 311 selects and uses each of a plurality of secondary batteries constituting the first battery 301 individually.

The first battery 301 supplies electric power to car parts for 42 V (for a high-voltage system) and the second battery 311 supplies electric power to car parts for 14 V (for a low-voltage system). Lead batteries are usually used for the second battery 311 due to cost advantage. Lead batteries have a disadvantage against lithium-ion secondary batteries: it is more likely to degrade due to a larger amount of self-discharge and a phenomenon called sulfation. The second battery 311 may be a lithium-ion secondary battery to eliminate the need for maintenance to its advantage; however, if it is used over a long time, for example three years or more, anomalies can be caused which were not recognizable when the battery was built. If the second battery 311, which starts the inverter, becomes out of function, it is impossible to start the motor though the first battery 301 still has a capacity; to prevent this, the first battery 301 supplies electric power to the second battery 311 to keep it fully charged if the second battery 311 is a lead battery.

In this embodiment, an example is shown in which lithium-ion secondary batteries are used for both of the first battery 301 and the second battery 311. A lead battery or an all-solid-state battery can be used for the second battery 311.

A lithium-ion secondary battery includes a positive electrode, a negative electrode, a separator, an electrolyte solution, and an exterior body. Note that in a lithium-ion secondary battery, the anode and the cathode interchange between charging and discharging, and the oxidation reaction and the reduction reaction interchange; thus, an electrode with a high reaction potential is called the positive electrode and an electrode with a low reaction potential is called the negative electrode. Thus, in this specification, the positive electrode is referred to as a "positive electrode" or a "+ electrode (plus electrode)" and the negative electrode is referred to as a "negative electrode" or a "– electrode (minus electrode)" in any of the case where charging is performed, where discharging is performed, where reverse pulse current is made to flow, and where charging current is made to flow. Using the terms of an "anode" and a "cathode" associated with an oxidation reaction and a reduction reaction might cause confusion because the anode and the cathode interchange between charging and discharging. Thus, the terms of the "anode" and the "cathode" are not used in this specification. If the terms of the "anode" or the "cathode" are used by any chance, it is clearly mentioned whether charging or discharging is performed and which one of the positive electrode (plus electrode) or the negative electrode (minus electrode) corresponds to the term.

In this embodiment, an example of a lithium-ion secondary battery is shown; however, it is not limited to a lithium-ion secondary battery and a material including an element A, an element X, and oxygen can be used as a positive-electrode material for the secondary battery. The element A is preferably one or more selected from the Group 1 elements and the Group 2 elements. As a Group 1 element, for example, an alkali metal such as lithium, sodium, or potassium can be used. As a Group 2 element, for example, calcium, beryllium, magnesium, or the like can be used. As the element X, for example, one or more selected from metal elements, silicon, and phosphorus can be used. The element X is preferably one or more selected from cobalt, nickel, manganese, iron, and vanadium. Typical examples include lithium-cobalt composite oxide ($LiCoO_2$) and lithium iron phosphate ($LiFePO_4$).

The negative electrode includes a negative-electrode active material layer and a negative-electrode current collector. In addition, the negative-electrode active material layer may contain a conductive additive and a binder.

For the negative-electrode active material, an element that can perform a charge-discharge reaction through an alloying reaction and a dealloying reaction with lithium can be used. For example, a material containing at least one of silicon, tin, gallium, aluminum, germanium, lead, antimony, bismuth, silver, zinc, cadmium, indium, and the like can be used. Such elements have higher capacity than carbon; in particular, silicon has a high theoretical capacity of 4200 mAh/g.

In addition, the secondary battery preferably includes a separator. As the separator, for example, a fiber containing cellulose, such as paper; nonwoven fabric; a glass fiber; ceramics; a synthetic fiber containing nylon (polyamide), vinylon (polyvinyl alcohol-based fiber), polyester, acrylic, polyolefin, or polyurethane; or the like can be used.

Regenerative energy generated by rolling of tires 316 is transmitted to a motor 304 through a gear 305 and a motor controller 303 and a battery controller 302 charges the first battery 301 or the second battery 311.

The first battery 301 is mainly used for driving the motor 304 and supplies electric power to car parts for 42 V (such as an electric power steering 307, a heater 308, and a defogger 309) through a DC-DC circuit 306. If there is a rear motor for the rear wheels, the first battery 301 is used to drive the rear motor.

The second battery 311 supplies electric power to car parts for 14V (such as an audio system, a power window 314, and lights 315) through a DC-DC circuit 310.

Figure 1B:
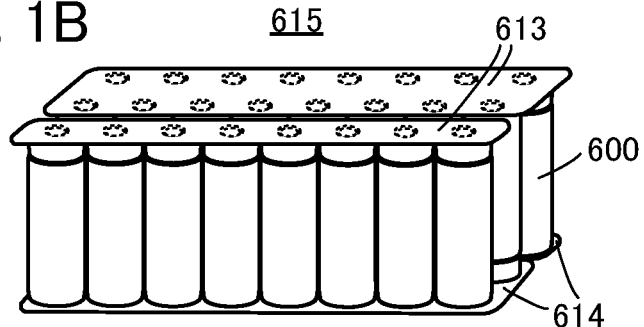

The first battery 301 includes a plurality of secondary batteries. Cylindrical secondary batteries 600 may be interposed between a conductive plate 613 and a conductive plate 614 to form a module 615 as shown in FIG. 1(B). In FIG. 1(B), switches are not illustrated between the secondary batteries. The plurality of secondary batteries 600 may be connected in parallel, connected in series, or connected in series after being connected in parallel. A large amount of electric power can be generated through forming the module 615 having the plurality of secondary batteries 600.

In order to cut off electric power from the plurality of secondary batteries, the secondary batteries on the vehicle are equipped with a service plug or a circuit breaker which can cut off a high voltage with no use of equipment; these are equipped on the first battery. For example, if 48 battery modules which each have two to ten cells are connected in series, a service plug or a circuit breaker is placed between the 24th module and the 25th module.

Figure 2A:
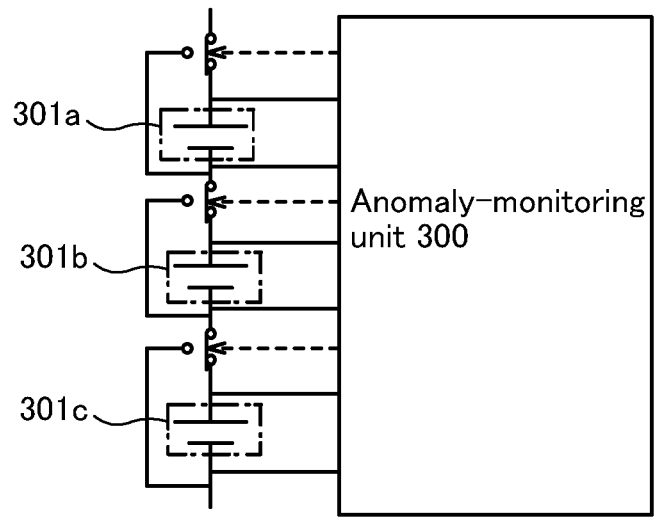
FIG. 2 Examples of a circuit diagram of one embodiment of the present invention.
Figure 2B:
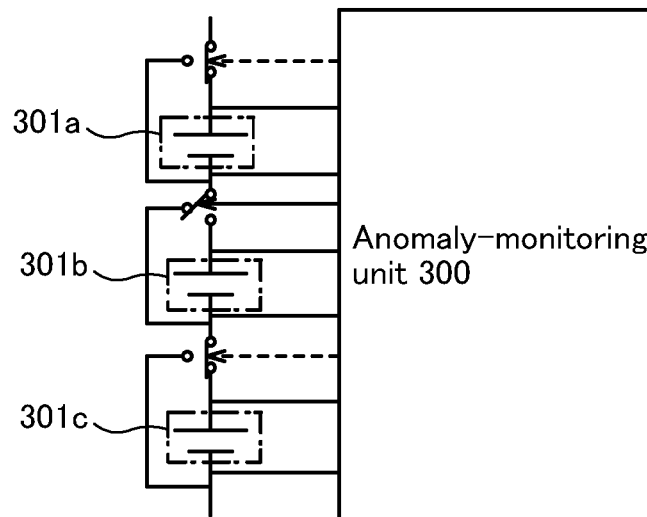

FIG. 2(A) shows a specific example in which secondary batteries 301*a*, 301*b*, and 301*c* are connected in series which are three out of the plurality of secondary batteries forming the first battery 301. Each secondary battery is equipped with a switch, and is connected to a bypassing circuit through the action of switching of the switch. A power MOSFET or the like is used for the switch. FIG. 2(B) shows that a switch is switched to stop supplying electric power to the secondary battery 301*b*.

The anomaly-monitoring unit 300 monitors each secondary battery 301*a*, 301*b*, and 301*c*, or controls the switches of them.

The anomaly-monitoring unit 300 inputs parameters of the secondary batteries 301*a*, 301*b*, and 301*c* into a neural network and analyzes the states of the secondary batteries.

For example, a pair of current data and voltage data of the secondary batteries can be sampled sequentially at regular intervals; then a predetermined number of pairs of data can be stored and used as input parameters. Alternatively, as the input parameters, the time and a pair of current data and voltage data of the secondary batteries at each time can be used. Here, the voltage of the secondary battery means, for example, a potential difference between both terminals of the secondary battery.

A pair of the capacity and the voltage of the secondary battery and the temperature thereof can also be used as input parameters. The capacity of the secondary battery can be obtained, for example, by the product of the current of the secondary battery and the time. The capacity of the storage battery may be obtained using a coulomb counter CC.

As input parameters, SOC (state of charge) of the secondary battery can also be used. The SOC of the secondary battery is represented, for example, by the ratio of the value to the full charge capacity; the value can be calculated through the action of subtracting the absolute value of the discharging capacity from the absolute value of the charging capacity of the secondary battery. Alternatively, the SOC of the secondary battery can be estimated on the basis of the voltage of the secondary battery.

When the secondary battery is charged or discharged, the voltage generally changes depending on the magnitude of the current value. For example, a voltage drop due to the resistance of the secondary battery changes depending on the magnitude of the current value. Therefore, in some cases, the resistance of the secondary battery can be calculated from the relationship between the voltage and the magnitude of the current value. The resistance value calculated in this manner may be used as an input parameter.

As an input parameter, the open circuit voltage (OCV, referred to as an open voltage in some cases) of the secondary battery may be used. The open circuit voltage of the secondary battery is, for example, a potential difference between the both terminals of the secondary battery in a state where no current flows therebetween. Here, the state where no current flows in the secondary battery means, for example, a state where no load is applied to the secondary battery and a state where a charging circuit is not electrically connected to the secondary battery. The resistance of the secondary battery sometimes can be calculated through the action of comparing the open circuit voltage to the voltage in a state where a noticeable amount of current flows in the secondary battery.

The anomaly-monitoring unit 300 has a microcomputer, inputs parameters of the secondary battery into a preprogrammed formula, and makes calculation; and thus a micro-short circuit between the positive electrode and the negative electrode of the secondary battery can be detected.

A circuit making neural network calculation (microcomputer) may be included in the anomaly-monitoring unit 300 to improve accuracy. When the anomaly-monitoring unit 300 detects an anomaly, connection between an anomalous battery and other normal batteries is cut through the action of switching the switch. Switching of the switch makes one battery unable to be used; thus the other batteries provide complemental output. Alternatively, amplification to a desired voltage is performed by another circuit.

In charging, only the other normal batteries are charged with the switch turned off.

A circuit which performs neural network calculation (microcomputer) may be provided in a vehicle or may be provided in a portable information terminal. The microcomputer includes a CPU, a ROM, a RAM, or the like. In the neural network calculation, communication with another computer may be performed and data stored in the other computer may be used. When the communication with another computer is performed and the data stored in the other computer is used to perform the neural network calculation, the neural network calculation can be performed using a huge amount of data.

The circuit which performs neural network calculation (microcomputer) may be included in the battery controller 302. This can reduce the number of IC chips.

The anomaly-monitoring unit 300 detects a secondary battery which may has an anomaly such as a micro-short circuit and stops using the secondary battery through the action of switching off the switch, which can secure the safety. Danger from continuous usage of the anomalous secondary battery and negative effects on the other secondary batteries can be avoided.

Embodiment 2

This embodiment shows an example of a configuration of a neural network NN.

Figure 3:
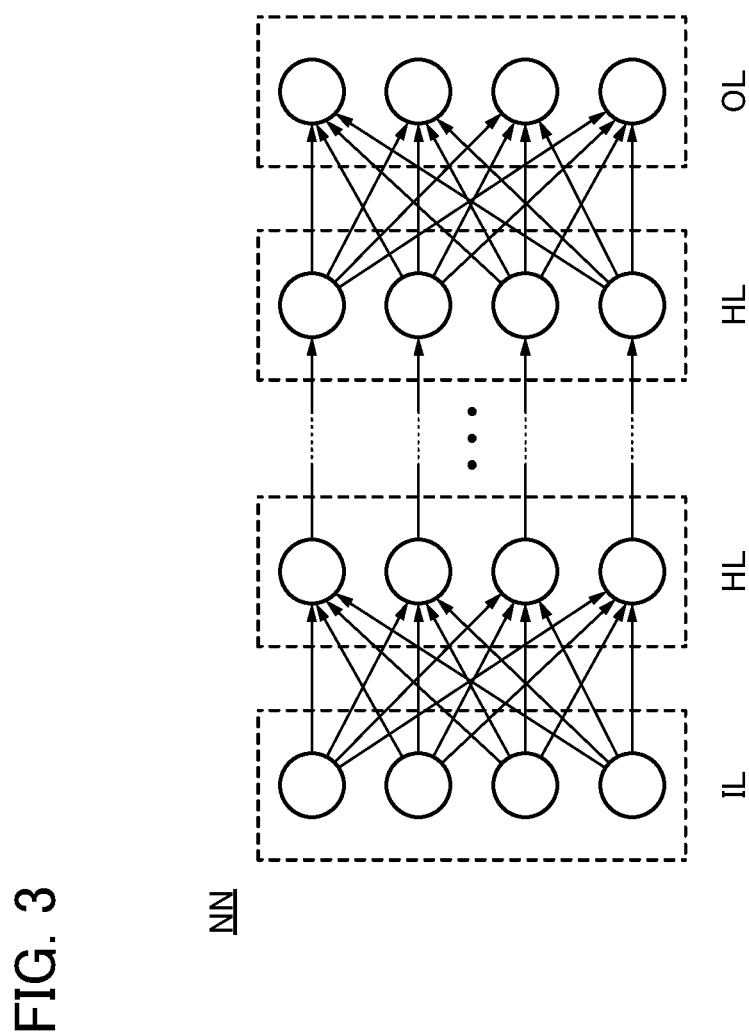
FIG. 3 A diagram showing a configuration of a neural network.

FIG. 3 illustrates an example of a neural network of one embodiment of the present invention. The neural network NN illustrated in FIG. 3 includes an input layer IL, an output layer OL, and hidden layers (middle layer) HL. The neural network NN can be formed of a neural network including the plurality of hidden layers HL, that is, a deep neural network. Learning for a deep neural network is referred to as deep learning in some cases. The output layer OL, the input layer IL, and the hidden layers HL each include a plurality of neuron circuits, and the neuron circuits provided in the different layers are connected to each other through a synapse circuit.

A function of analyzing the state of a storage battery is added to the neural network NN by learning. When parameters of the storage battery that have been measured are input into the neural network NN, arithmetic processing is performed in each layer. The arithmetic processing in each layer is executed through, for example, the product-sum operation of the output from a neuron circuit in the previous layer and a weight coefficient. Note that the connection between layers may be a full connection where all of the neuron circuits are connected or may be a partial connection where some of the neuron circuits are connected.

For example, a convolutional neural network (CNN), which includes a convolutional layer and a pooling layer in which only specific units in adjacent layers have connection, may be used. A CNN is used for image processing, for example. In the convolutional layer, a product-sum operation with image data and a filter is performed, for example. The pooling layer is preferably placed directly after the convolutional layer.

The convolutional layer has a function of performing convolution on image data. The convolution is performed by repetition of the product-sum operation of part of the image data and the weight filter's value. Features of an image are extracted through the convolution in the convolutional layer.

A weight filter can be used for the convolution. The image data input onto the convolutional layer is subjected to filter processing using the filter.

The data subjected to the convolution is converted by an activation function, and then output to the pooling layer. As the activation function, ReLU (Rectified Linear Units) or the like can be used. The ReLU is a function that outputs "0" when an input value is negative and outputs the input value as it is when the input value is greater than or equal to "0". As the activation function, a sigmoid function, a tanh function, or the like may be used as well.

The pooling layer has a function of performing pooling on the image data input from the convolutional layer. Pooling is a process in which the image data is partitioned into a plurality of regions, and a predetermined type of data is extracted from each of the regions and arranged in a matrix. The pooling reduces the image data with the features extracted by the convolutional layer remaining. As the pooling, max pooling, average pooling, Lp pooling, or the like can be used.

In the convolutional neural network (CNN), feature extraction is performed using the above-described convolution processing and pooling processing. Note that the CNN can be composed of a plurality of convolutional layers and a plurality of pooling layers.

A fully-connected layer is preferably placed after several sets of convolutional layers and pooling layers that are arranged alternately, for example. A plurality of fully-connected layers may be placed. The fully-connected layer preferably has a function of determining an image using the image data subjected to the convolution processing and the pooling processing.

Figure 4A:
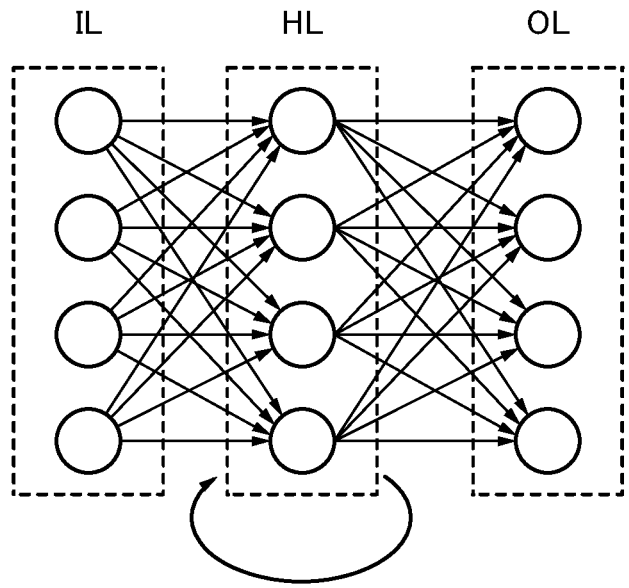
FIG. 4 Diagrams showing a configuration of a neural network.

A configuration example of the neural network NN illustrated in FIG. 4(A) is referred to as a recurrent neural network (RNN) in some cases. In the recurrent neural network illustrated in FIG. 4(A), since a hidden layer HL has a feedback loop, the output from the hidden layer HL is input (fed back) to itself. Time-series data can be analyzed and data estimation can be performed with RNN. For example, in the neural network of one embodiment of the present invention, data after a predetermined time can be estimated on the basis of a past charge and a discharge curve.

Figure 4B:
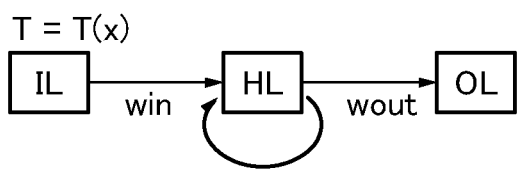

FIG. 4(B) is a diagram in which an RNN at Time T=T(x) is simply shown. A weight coefficient from the input layer IL to the hidden layer HL is represented by win, a weight coefficient from the hidden layer HL to the output layer OL is represented by wout, and a weight coefficient that is fed back from the hidden layer HL is represented by Wr.

Figure 4C:
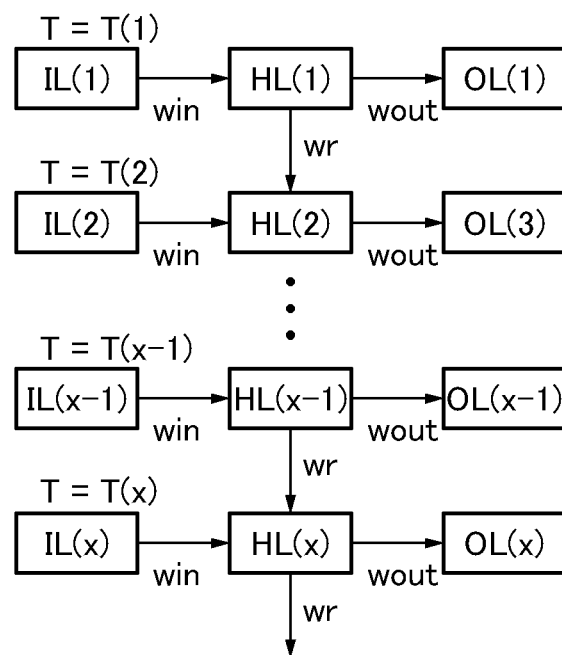

The RNN can be considered to have different layers (an input layer IL(1) to an input layer IL(x), a hidden layer HL(1) to a hidden layer HL(x), and an output layer OL(1) to an output layer OL(x)) at each time (each time of Time T(1) to T(x) in FIG. 4) as shown in FIG. 4(C) when being expanded in the time axis. The RNN can be regarded as a forward propagation network without a feedback loop as shown in FIG. 4(C) when being expanded in the time axis.

As a neural network, a configuration called a long short-term memory (LSTM) can be used. In LSTM, RNN has a hidden layer including a memory cell to store a state, which realizes analysis, such as prediction, for a longer period of time.

Configuration examples of the neural network NN having a learning function will be described. FIG. 5 illustrates configuration examples of the neural network NN. The neural network NN is composed of neuron circuits NC and synapse circuits SC provided between the neuron circuits.

Figure 5A:
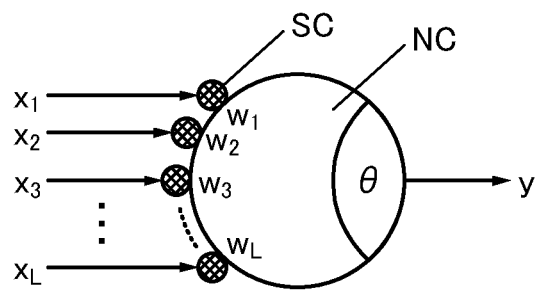
FIG. 5 Diagrams showing configurations of a neural network.

FIG. 5(A) illustrates a configuration example of a neuron circuit NC and synapse circuits SC which constitute the neural network NN. Input data $x_1$ to input data $x_L$ (L is a natural number) are input to the synapse circuits SC. The synapse circuits SC have a function of storing a weight coefficient $w_k$ (k is an integer greater than or equal to 1 and less than or equal to L). The weight coefficient $w_k$ corresponds to the connection strength between the neuron circuits NC.

When $x_1$ to $x_L$ are input into the synapse circuits SC, the products of input data $x_k$ which is input into the synapse circuit SC and a weight coefficient $w_k$ which is stored in the synapse circuits SC ($x_k w_k$) for k being 1 to L are added ($x_1 w_1 + x_2 w_2 + \ldots + x_L w_L$), that is, a value obtained by the product-sum operation of $x_k$ and $w_k$ is supplied to the neuron circuit NC. When the value is larger than the threshold θ of the neuron circuit NC, the neuron circuit NC outputs a high-level signal y. This phenomenon is referred to as firing of the neuron circuit NC.

Figure 5B:
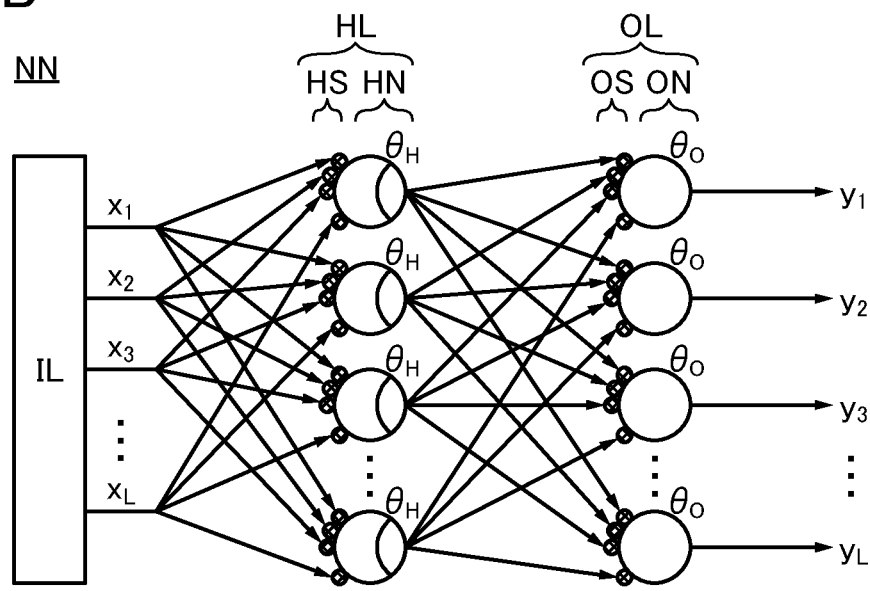

FIG. 5(B) shows a model of a hierarchical perceptron neural network NN using the neuron circuits NC and the synapse circuits SC. The neural network NN includes the input layer IL, the hidden layer (middle layer) HL, and the output layer OL.

The input data $x_1$ to the input data $x_L$ are output from the input layer IL. The hidden layer HL includes hidden synapse circuits HS and hidden neuron circuits HN. The output layer OL includes output synapse circuits OS and output neuron circuits ON.

A value obtained by the product-sum operation using the input data $x_k$ and the weight coefficient $w_k$ that is held in the hidden synapse circuit HS is supplied to the hidden neuron circuit HN. Then, a value obtained by the product-sum operation using the output from the hidden neuron circuit HN and the weight coefficient $w_k$ that is held in the output synapse circuit OS is supplied to the output neuron circuit ON. Then, output data $y_1$ to output data $y_n$ are output from the output neuron circuits ON.

As described above, the neural network NN to which predetermined input data is supplied has a function of outputting, as output data, values corresponding to weight coefficients retained in the synapse circuits SC and the thresholds θ of the neuron circuits.

Figure 5C:
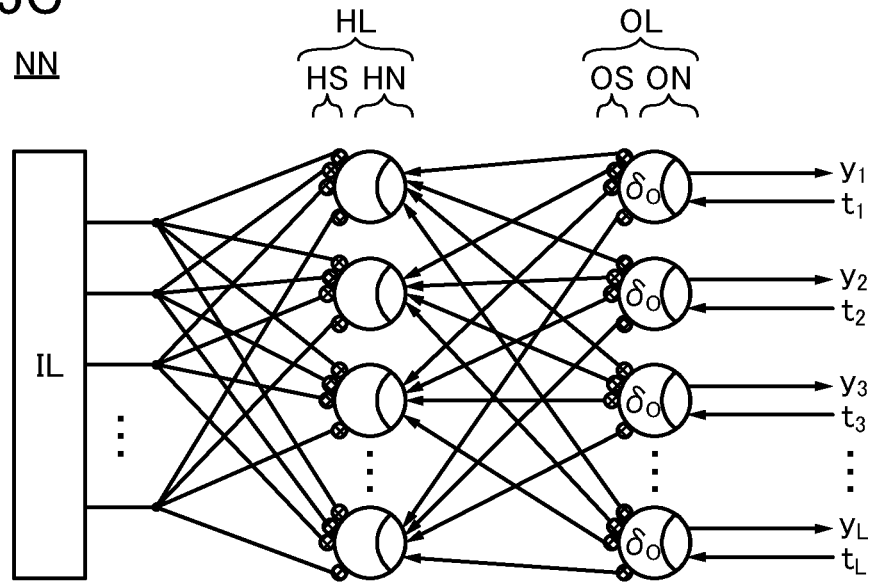

The neural network NN can perform supervised learning by the input of teacher data. FIG. 5(C) shows a model of the neural network NN which performs supervised learning using backpropagation method.

The backpropagation method is a method of changing a weight coefficient $w_k$ of a synapse circuit so that the difference between output data from a neural network and teacher data is reduced. Specifically, the weight coefficient $w_k$ of the hidden synapse circuit HS is changed in accordance with a difference $\delta_O$ that is determined on the basis of the output data $y_1$ to $y_n$ and the teacher data $t_1$ to $t_L$. A weight coefficient $w_k$ of a synapse circuit SC in the previous stage is changed in accordance with the amount of change in the weight coefficient $w_k$ of the hidden synapse circuit HS. In this manner, weight coefficients of the synapse circuits SC are sequentially changed on the basis of the teacher data $t_1$ to the teacher data $t_L$, so that the neural network NN can perform learning.

Though one hidden layer HL is illustrated in FIG. 5(B) and FIG. 5(C), the number of the hidden layers HL can be two or more. The use of a neural network including two or more hidden layers HL (a deep neural network (DNN)) enables deep learning. This improves the accuracy of state estimation for a storage battery.

When an RNN is expanded in the time axis, it can be regarded as a forward propagation network without a feedback loop as described in FIG. 4(C). In the forward propagation network, a weight coefficient can be changed in accordance with teacher data using the above backpropagation method or the like.

This embodiment can be combined with the description of the other embodiments as appropriate.

Embodiment 3

In this embodiment, an example will be described in which a neural network is used for estimation and detection of a secondary battery's anomaly (specifically, the occurrence of a micro short-circuit).

Figure 6A:
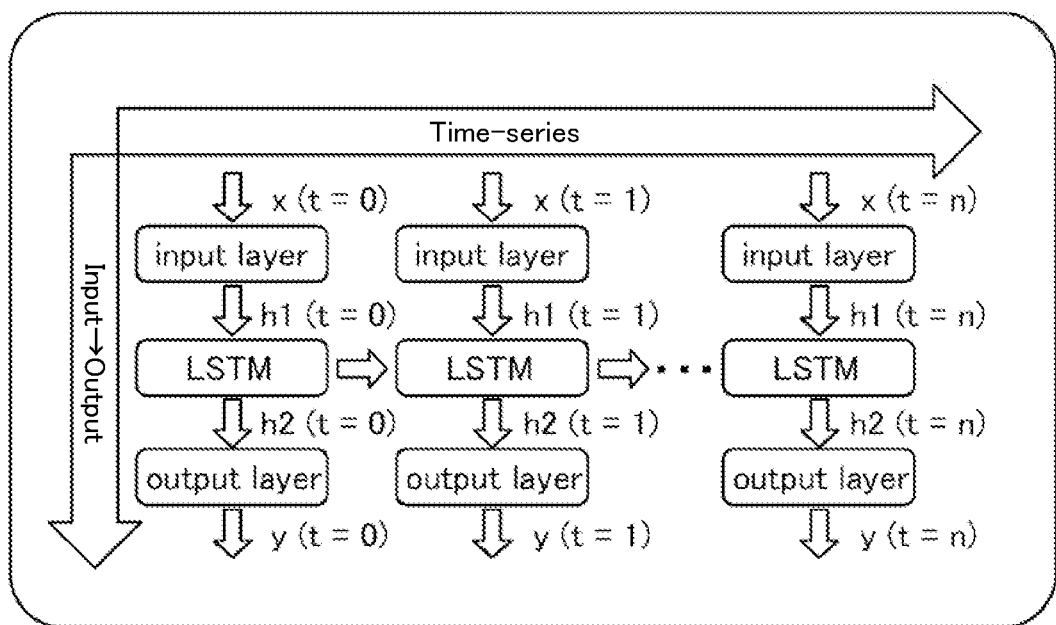
FIG. 6 Diagrams showing an LSTM network model and charging curves.
Figure 6B:
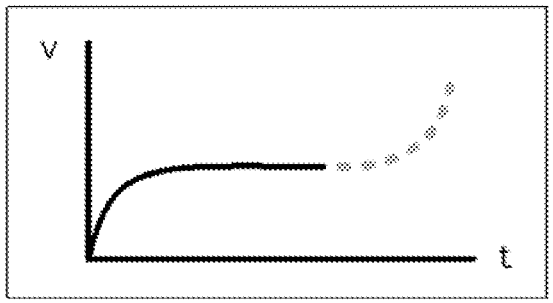
Figure 6C:
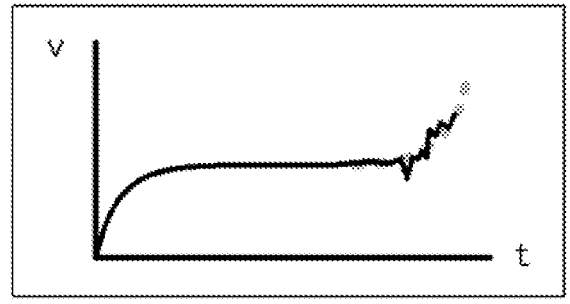

FIG. 6(C) is an example of a schematic view of a charge and discharge curve which represents the occurrence of a micro short-circuit.

A thinner separator to make a secondary battery smaller and rapid charging with a high voltage are desired for an ideal secondary battery; both of them have configurations to suffer a micro-short circuit easily. Repetition of micro-short circuits may cause a secondary battery to generate unusual heat and may lead to severe accidents such as a fire.

Therefore, estimating the occurrence of a secondary battery's anomaly with a neural network is addressed first, which is for making a storage system which finds a micro short-circuit in its early stage to prevent a severe accident beforehand or making a control system for a secondary battery.

A recurrent neural network called LSTM is used for a neural network. An LSTM's network is a model suitable for processing the time-series data; a charging voltage is measured at regular intervals and bit later charging characteristics can be estimated from the accumulated time-series data. FIG. 6(A) shows a network model of the LSTM. In FIG. 6(A), "input layer" represents input layers, "h1" and "h2" represent hidden layers, and "output layer" represents main layers.

In FIG. 6(B), the solid line is an ongoing charging curve and the dotted part is an estimated charging curve.

Specifically, normal charging curves are learned; when an estimated bit later charging curve is overlapped, it is determined that there is no anomaly; however, when the curve disturbance as shown at the right edge of the charging curve in FIG. 6(C), which means a micro short-circuit, appears and a charging curve diverges from a normal charging curve, the existence an anomaly is determined and detected.

Figure 7:
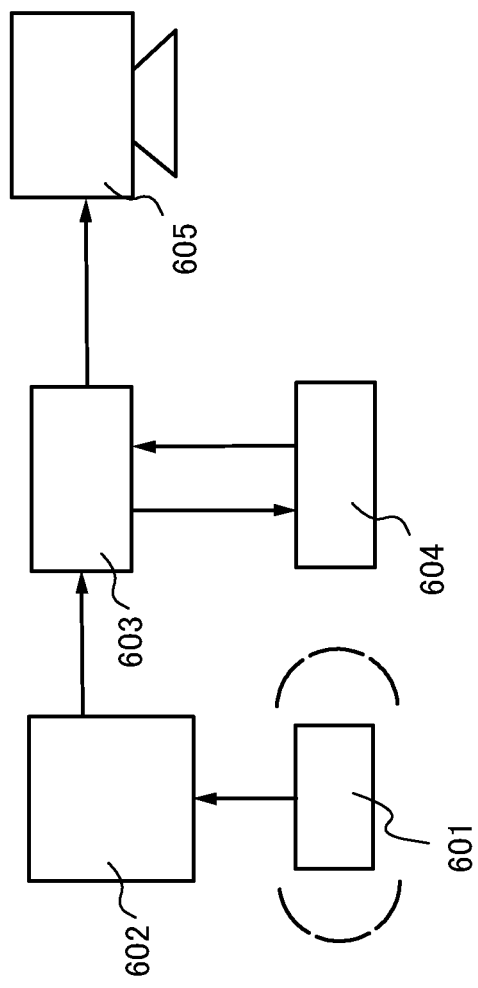
FIG. 7 A diagram of a block diagram of a system.

FIG. 7 is a block diagram of a device; the device artificially causes micro short-circuits which occur in a lithium-ion secondary battery, predicts its behavior, and shows on a display its state (the charging curve) simultaneously.

In FIG. 7, 601 denotes an artificial-anomaly-generating switch and 602 is an emulator which can be regarded as a battery. The emulator 602 outputs charging measurement data and a controller IC 603 measures it and makes a determination. It is set that the controller IC 603 inputs input data for product-sum operation into a microcomputer 604, the microcomputer 604 outputs the operation result, and the predicted data and the measured data are shown on a display 605 to be compared. The display 605 of a laptop computer can show two charging curves (for example, a green one: measured data and a yellow one: a predicted charging curve). Though one microcomputer is used in the example of FIG. 7, a plurality of microcomputers can be used when determination for 100 or more secondary batteries is accurately made in a short time.

Figure 8A:
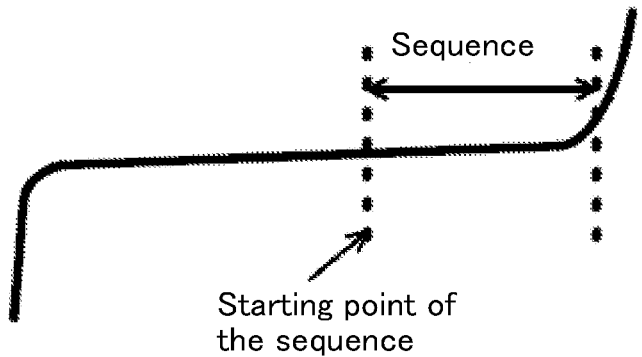
FIG. 8 Diagrams showing processing of input data.
Figure 8B:
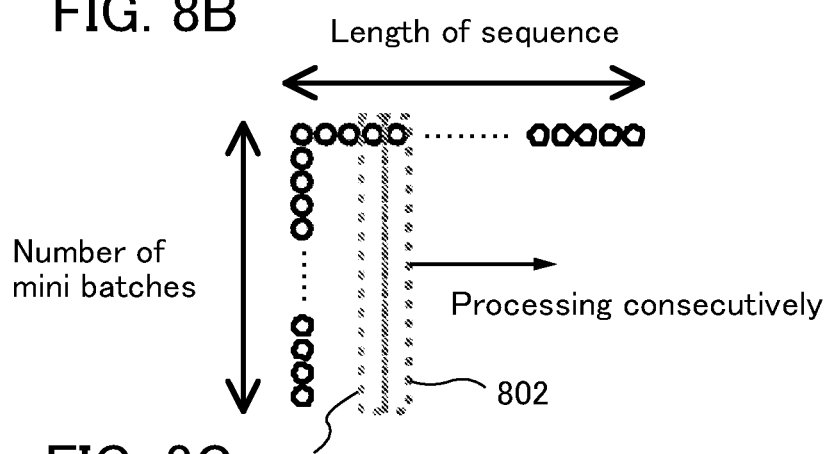

Input data for learning is described with FIG. 8(A) and FIG. 8(B).

The secondary battery voltage ranges from 3.0 V to about 4.2 V; the time of the condition which requires the longest charging time is set to be a reference, and ends of the other curves with no data are padded with the maximum voltage to the terminal time.

Next, the processing done on the input data is described.

From the condition which requires the longest charging time, the maximum time is determined. The maximum voltage is applied to the ends of the other conditions to the terminal time. As the measuring periods are irregular, data at one-second intervals is subjected to linear interpolation. The data below or equal to 2.5 V is deleted. If there are too many measuring points, memory interconnection of LSTM becomes weak; thus, data is evenly thinned out. The voltage is regularized (specifically a voltage of 3.0 V or more is one, and the others are zero).

From the normalized voltage data, sequences are picked up and bundled as many as mini batches. As illustrated in FIG. 8(A), the starting point of a sequence is randomly determined.

The data on the mini batch number and the sequence length is input data into a neural network model. That is, the input data has the two dimensional arrangement of the number of mini batches and the length of sequences. Accordingly the learning data has the two dimensional arrangement of the number of mini batches and the length of sequences. In contrast, data for prediction has the two dimensional arrangement with one fixed mini batch number.

Figure 8C:
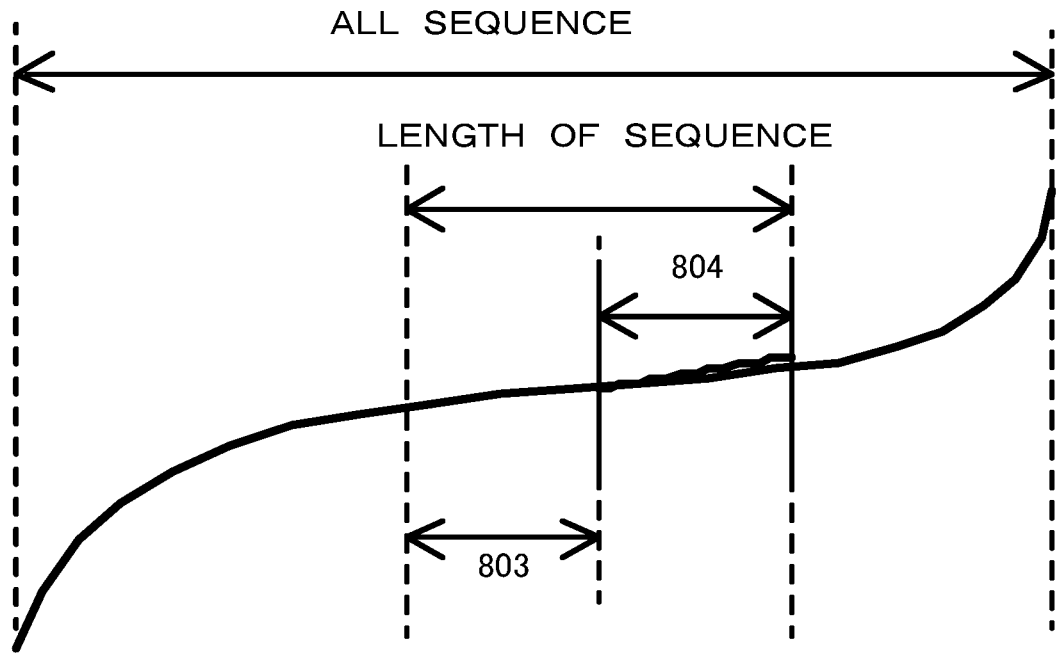

FIG. 8(B) shows that consecutively from the beginning of the input data sequence, the data on the mini batch number is stored in an arrangement x801, and the data which follows the data in x801 is stored in an arrangement t802. FIG. 8(C) shows a setting: the sequence length of the entire graph (ALL SEQUENCE) is 300, the former half 803 of the length of sequence (LENGTH OF SEQUENCE) is used for prediction, and a predicted data length 804 is shown, which shows the difference from the actual measurement.

The LSTM algorithm stated above is described in detail below. LSTM is a model suitable for time-series data. This can estimate charging characteristics simultaneously and detect anomalies immediately if they happen. LSTM generally has a complicated circuit configuration and requires high calculation accuracy.

$$LSTM: h_t^{l-1}, h_{t-1}^l, c_{t-1}^l \rightarrow h_t^l, c_t^l \quad \text{[Formula 1]}$$

$$\begin{pmatrix} i \\ f \\ o \\ g \end{pmatrix} = \begin{pmatrix} sigm \\ sigm \\ sigm \\ sigm \end{pmatrix} T_{2n,4n} \begin{pmatrix} h_t^{l-1} \\ h_{t-1}^l \end{pmatrix}$$

$$c_t^l = f \odot c_{t-1}^l + i \odot g$$

$$h_t^l = o \odot \tanh(c_t^l)$$

In the above algorithm, t represents time and l is the index of the layers. That is, t−1 represents the previous time and l−1 represents the previous layer. The symbol e of the above formula which means the Hadamard product (element product) represents element wise multiplication and performs the operation like the formula below.

$$\vec{a} \odot \vec{b} = (a_1 \times b_1, a_2 \times b_2, \ldots, a_n \times b_n) \quad \text{[Formula 2]}$$

T is a matrix operation transforming the 2n dimensions to the 4n dimensions: it performs "sigm" and "tanh" calculations on n-element basis and transformation to vectors of i (input gate), f (forget gate), o (output gate), and g (input modulation gate) with n elements is performed. "Sigm" means calculation of a sigmoid function and "tanh" means calculation of a "hyperbolic tangent function".

The kinds of the above calculations include a product-sum operation, an element wise multiplication, and an activation function (sigmoid or tanh). LSTM may interpose a full connection network inbetween, and the "product-sum operation" is performed there.

Calculation in the L layer is performed in Time=0 to t steps; during this calculation, weight is set not to change in the estimation calculation. Note that in this embodiment, Time=0 substantially corresponds to 1; thus the step is 1 to t+1 step. The previous cell state and the previous output are stored to be used in the next time step. New input data is input each time. (Stored values of the cell state and the output are not necessary any more after being used as an input value, so these can be rewritten.)

Figure 9:
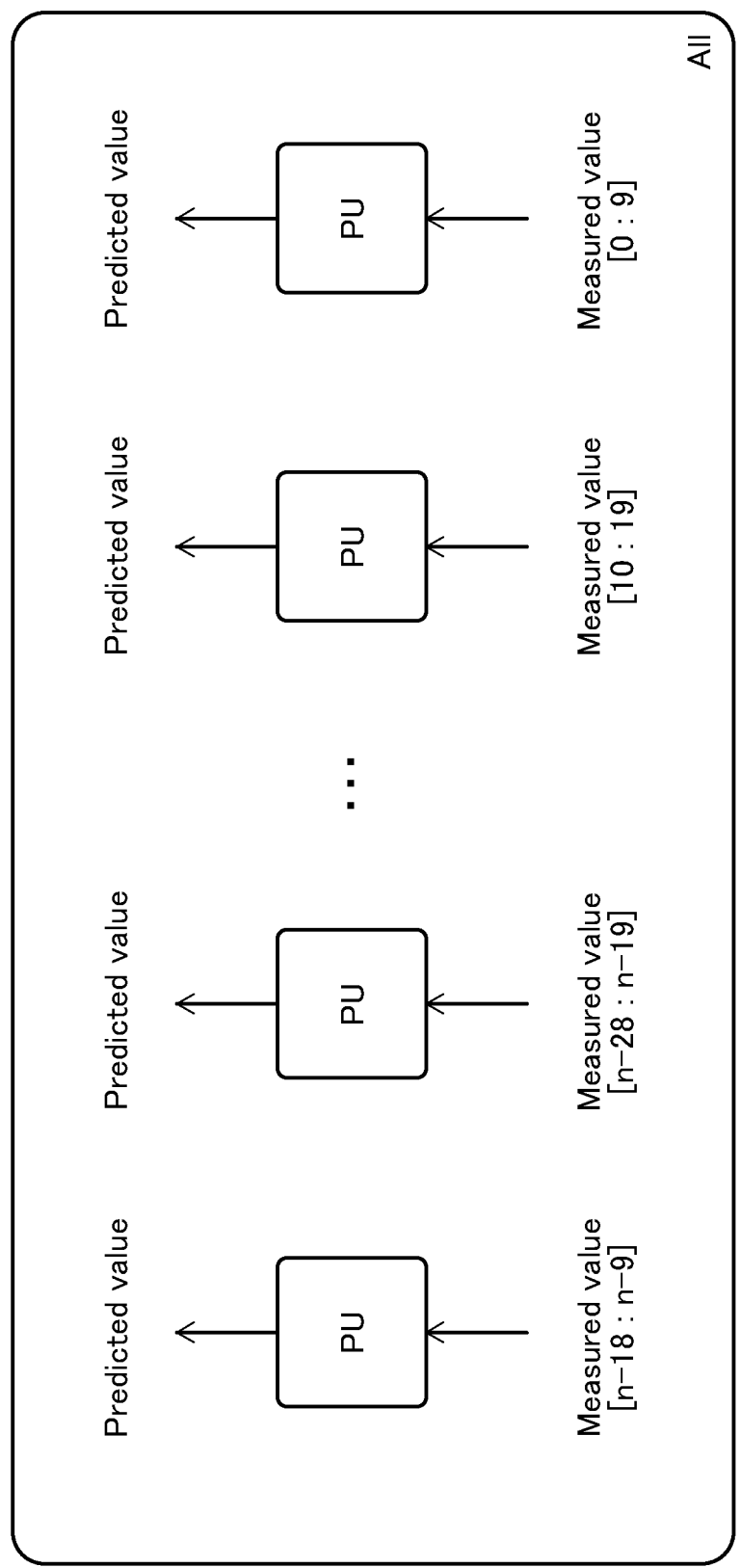
FIG. 9 A diagram showing an entire algorithm.
Figure 10:
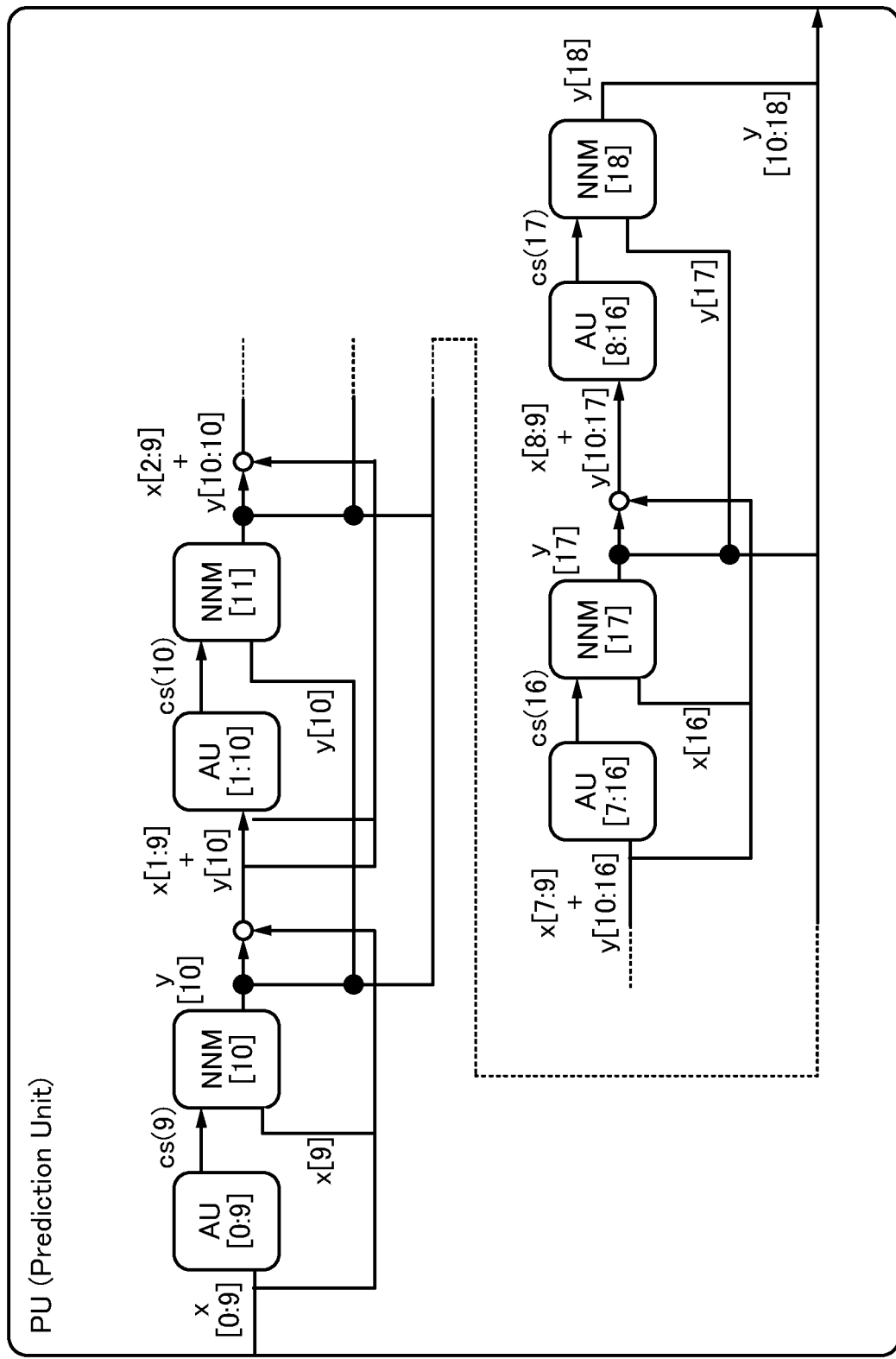
FIG. 10 A diagram showing an algorithm.
Figure 11:
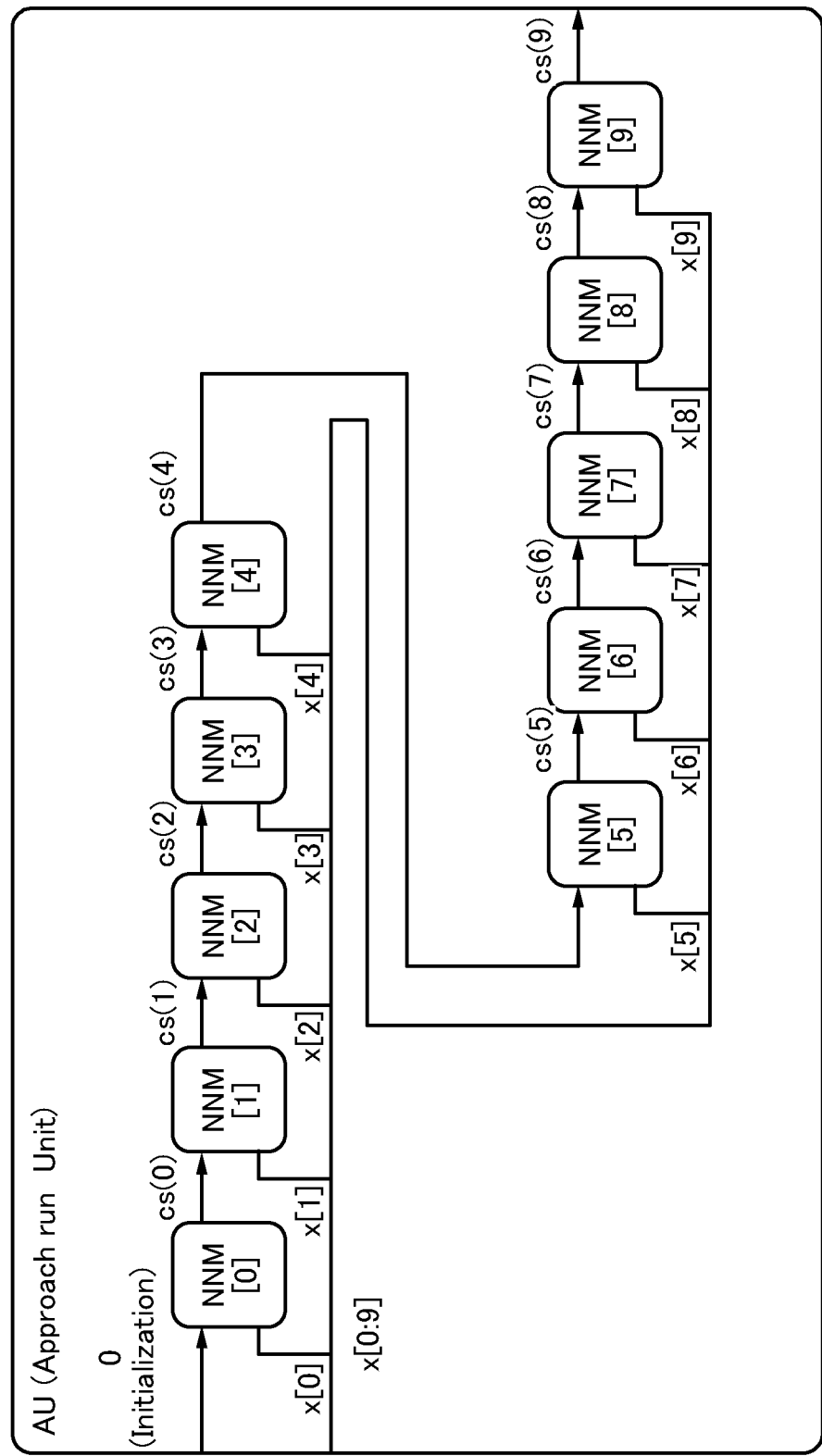
FIG. 11 A diagram showing an algorithm.
Figure 12:
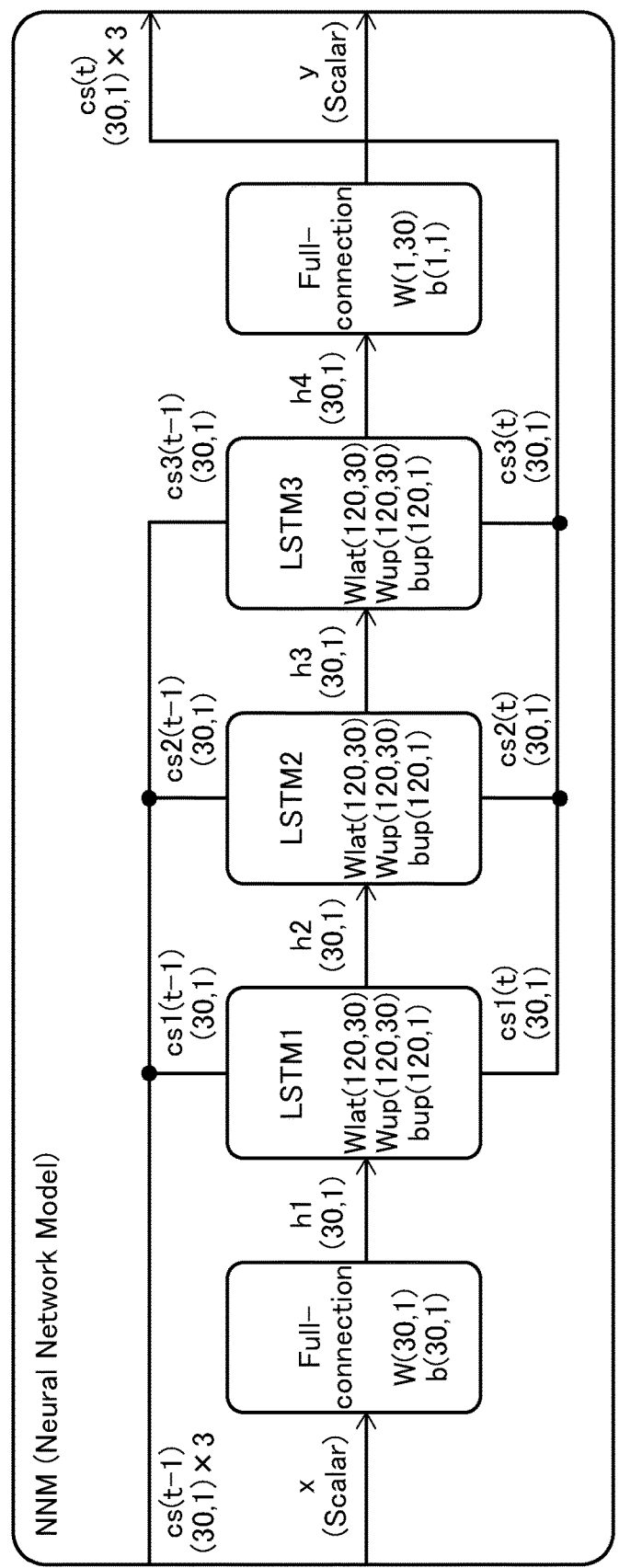
FIG. 12 A diagram showing an algorithm.
Figure 13:
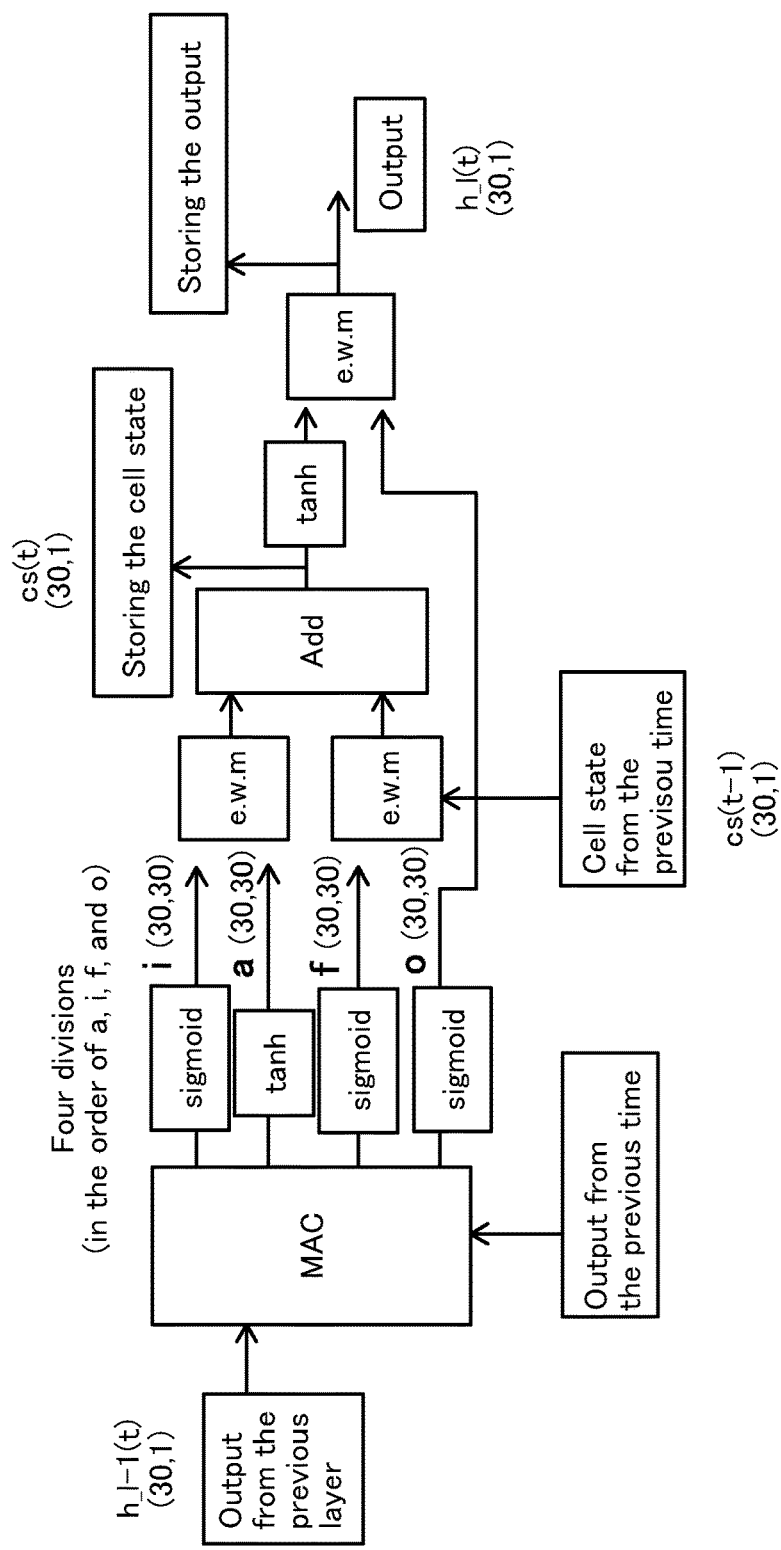
FIG. 13 A diagram showing an algorithm of an LSTM.

FIG. 9 shows the actual whole operations. Measured values are input into a prediction unit (PU) and predicted values are output in the conceptual diagram in FIG. 9. FIG. 10 shows the PU configuration of FIG. 9. An AU (Approach Unit) configuration in FIG. 10 is shown in FIG. 11. FIG. 12 shows an NNM (Neural Network Model) unit of FIG. 11. In FIG. 12, W, $W_{lat}$, and $W_{up}$ are weights, and b and $b_{up}$ are unit biases. FIG. 12 shows a schematic view that X (Scalar) is input, passes through a fully-connected layer, LSTM 1, LSTM 2, and LSTM 3, and a fully-connected layer, and Y (Scalar) is output. In FIG. 12, cs means a cell state (cell state). A unit of LSTM in FIG. 12 is illustrated in FIG. 13. FIG. 13 shows an algorithm of an LSTM. In FIG. 13, e.w.m means element-wise multiplication (also referred to as a Hadamard product) that is a product by vanants, which requires change of values each time.

In FIG. 12, a network is composed of five layers, and three of them are LSTMs (LSTM 1, LSTM 2, LSTM 3). The number of hidden layers is 30. The number of data used for prediction is 20 and prediction data is the following 20 data. In MAC, $2n \times 4n = 8n^2$ multiplications and 2n additions are performed. The number of multiplication in e.w.m is $n \times 3 = 3n$, and n additions, 3n sigmoid function calculations, and 2n tanh function calculations are performed. (In the Chainer's code, multiplication and addition to the input and multiplication and addition to the output from the previous time are separately performed and are finally added. The above calculation results in the same value as additions are performed.) Thus, the larger n becomes, the more percentage MAC processing occupies in the calculation. The first algorithm only uses the input and output from the previous time to calculate i, f, o, and g; but in this case, the cell state is used for calculating i, f, and o. Note that Chainer uses the first algorithm. The process of FIG. 13 (only forward process) is explained: in the first step, the input data $h^{(0, t)}$ at the time t (the number of arrangement is 1) is multiplied by a "1×5" matrix to obtain the arrangement $h^{(1, t)}$. (The arrangement $h^{(1)}$ has five elements.) In the second step, the arrangement $h^{(1, t)}$ and the previous time's output arrangement $h^{(2, t-1)}$ are multiplied by a "10×20" matrix to obtain the arrangement $h^{(2, t)}$. (The arrangement $h^{(2)}$ has 20 elements.) There is no previous time's output at first (zero vector). In the third step, the arrangement $a^{(2, t)}$ is divided into four groups each including five elements and activation function is applied to each of them. (The arrangement "i", "f", "o", and "g" have five variants.) In the fourth step, the element-wise multiplications shown in the equation 3 and equation 4 (also referred to as Hadamard product) are performed to obtain the cell state "$c^{(2, t)}$" and the arrangement $h^{(2, t)}$.

$$c^{(2,t)} = f \odot c^{(2,t-1)} + i \odot g \quad \text{[Equation 3]}$$

$$h^{(2,t)} = o \odot \tanh(c^{(2,t)}) \quad \text{[Equation 4]}$$

Note that the cell state "$c^{(2, t)}$" and the arrangement $h^{(2, t)}$ are transmitted to the next time's calculation and the first one does not have a previous time's cell state "c" (zero vector). In the fifth step, $h^{(2, t)}$ (the number of arrangements is five) is multiplied by a matrix "5×1" to obtain the arrangement $h^{(3, t)}$ as the output (the arrangement $h^{(3, 1)}$ shown in the Equation 5 below has one element).

$$h_j^{(3,t)} = \sum_i w_{i,j}^{(2)} h_i^{(2,t)} \quad \text{[Equation 5]}$$

The first to the fifth steps of the calculation are made to each time.

The wave predicted by the algorithm above is accurately predicted, and a control system which stops charging or make a caution immediately after an anomaly is detected can be made.

Embodiment 4

In this embodiment, examples of electronic devices incorporating the charging control device of a plurality of secondary batteries described in Embodiment 1 will be described.

Examples of electronic devices in which the charging control device of a plurality of secondary batteries described in Embodiment 1 is used are as follows: display devices (also referred to as televisions or television receivers), desktop personal computers, laptop personal computers, monitors for computers or the like, electric schedule books, electric translating machines, toys, audio input devices such as microphones, electric shavers, electric toothbrushes, high-frequency heating appliances such as microwave ovens, electric rice cookers, electric washing machines, electric vacuum cleaners, water heaters, electric fans, hair dryers, air-conditioning systems such as humidifiers, dehumidifiers, and air conditioners, dishwashers, dish dryers, clothes dryers, futon dryers, electric refrigerators, electric freezers, electric refrigerator-freezers, freezers for preserving DNA, flashlights, electric power tools, alarm devices such as smoke detectors, gas alarm devices, and security alarm devices, industrial robots, health equipment and medical equipment such as hearing aids, cardiac pacemakers, X-ray equipment, radiation counters, electric massagers, and dialyzers, mobile phone devices (also referred to as mobile phones or cell phones), portable game consoles, portable information terminals, lighting devices, headphone stereos, stereos, remote controllers, clocks such as table clocks and wall clocks, cordless phone handsets, transceivers, pedometers, calculators, portable or stationary music reproduction devices such as digital audio players, and large game machines such as pachinko machines.

The charging control device of a plurality of secondary batteries shown in Embodiment 1 can be embedded in an interior or an exterior wall of a house or a building.

The charging control device of a plurality of secondary batteries shown in Embodiment 1 ensures high safety, which improves safety of a vehicle incorporating the charging control device.

Incorporating the charging control device of a plurality of secondary batteries shown in Embodiment 1 in a vehicle can enable next-generation clean energy automobiles such as hybrid electric vehicles (HEV), electric vehicles (EV), and plug-in hybrid electric vehicles (PHEV). Alternatively, power storage devices can be incorporated in moving objects such as agricultural machines, motorized bicycles including motor-assisted bicycles, motorcycles, electric wheelchairs, electric carts, boats or ships, submarines, aircraft such as fixed-wing aircraft and rotary-wing aircraft, rockets, artificial satellites, space probes, planetary probes, and spacecraft.

In FIG. 14, examples of moving objects using one embodiment of the present invention are illustrated. An automobile 2001 illustrated in FIG. 14(A) is an electric vehicle that runs on an electric motor as a power source. Alternatively, the automobile 2001 is a hybrid electric vehicle capable of appropriately selecting and using an electric motor and an engine as a power source for driving. When secondary batteries are incorporated in a vehicle, a plurality of secondary batteries shown in FIG. 1(B) as an example is set in one place or more places. The automobile 2001 shown in FIG. 14(A) has a battery pack 2100 and the battery pack has a secondary battery module in which a plurality of secondary batteries are connected and a charging control device which is electrically connected to the secondary battery module.

The charging control device for secondary batteries shown in Embodiment 1 monitors the plurality of secondary batteries; when one of the plurality of the secondary batteries has an anomaly in charging and discharging for the vehicle's driving, the anomalous secondary battery is bypassed to stop being used through the action of switching the switch. One embodiment of the present invention can improve safety.

To improve the driving distance while using a plurality of secondary batteries, a secondary battery with high degradation and low voltage is switched off not to be used, which can improve the driving distance, for example. A conventional charging control device may stop supplying power if the lowest voltage of the secondary batteries or the average voltage of all the secondary batteries falls below a predetermined value. The use of the charging control device of this embodiment can improve the average voltage of all the secondary batteries by switching the switches of some secondary batteries to change the lowest voltage of the secondary batteries.

The automobile 2001 can be charged when the power storage device of the automobile 2001 receives electric power from an external charging equipment through a plug-in system, a contactless charging system, or the like. In charging, a given method such as CHAdeMO (registered trademark) or Combined Charging System may be employed as a charging method, the standard of a connector, or the like as appropriate. The charging device may be a charging station provided in a commerce facility or a household power supply. For example, a plug-in technique enables an exterior power supply to charge the power storage device incorporated in the automobile 2001. Charging can be performed through the action of converting AC power into DC power with a converter such as an AC-DC converter.

Furthermore, although not illustrated, a power-receiving device can be incorporated in the vehicle, and the vehicle can be charged in a contactless manner through the action of being supplied with power from an aboveground power-transmitting device. In the case of this contactless power feeding system, an incorporated power-transmitting device in a road or an exterior wall can charge not only a stopping vehicle but also a running vehicle. In addition, the contactless charging system may be utilized to perform transmission and reception of electric power between two vehicles. Furthermore, a solar cell may be provided on the exterior of the vehicle to charge the power storage device when the vehicle stops or moves. For supply of power in such a contactless manner, an electromagnetic induction method or a magnetic resonance method can be used.

According to one embodiment of the present invention, stopping using the anomalous secondary battery out of the plurality of secondary batteries by switching the switch can shorten the charging period when the secondary batteries are charged.

Figure 14A:
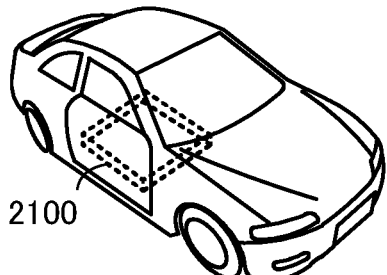
FIG. 14 Diagrams showing examples of moving objects.
Figure 14B:
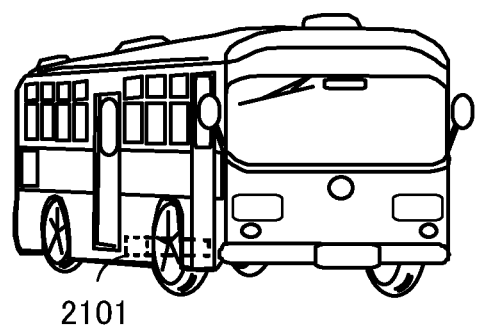

FIG. 14(B) shows a large transporter 2002 having a motor controlled by electric power as an example. The secondary battery module of the transporter 2002 has a cell unit of four secondary batteries 3.5 V or more and 4 V or lower, and 48 cells are connected in series to have 170 V as the maximum voltage. A battery pack 2101 has the same function as that in FIG. 14(A) except the number of secondary batteries forming the secondary battery module of the battery pack or the like; thus the description is omitted.

Figure 14C:
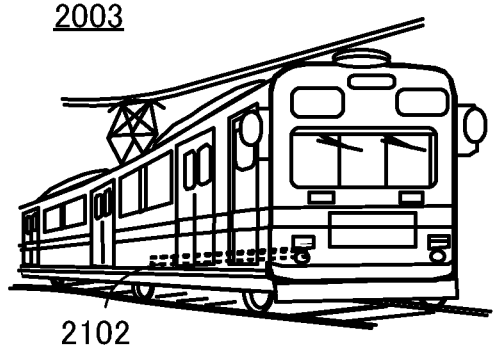

FIG. 14(C) shows a large transportation vehicle 2003 having a motor controlled by electricity as an example. The secondary battery module of the transportation vehicle 2003 has more than 100 secondary batteries with 3.5 V or more and 4 V or lower connected in series, and the maximum voltage is 600 V. A secondary battery 2102 has the same function as that in FIG. 14(A) except the number of secondary batteries forming the secondary battery module of the battery pack; thus the detailed description is omitted.

Figure 14D:
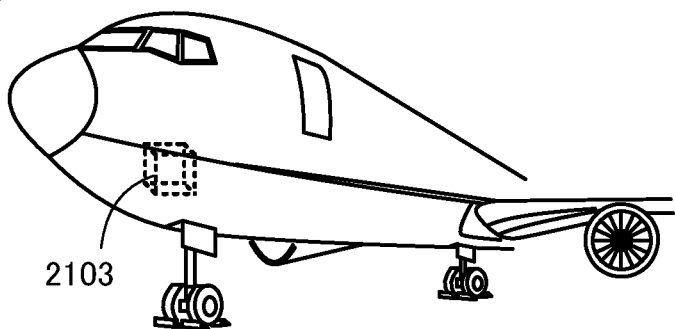

FIG. 14(D) shows an aircraft 2004 having a combustion engine as an example. The aircraft 2004 shown in FIG. 14(D) has a battery pack 2103, which includes a secondary battery module and a charging control device, and the secondary battery module includes a plurality of connected secondary batteries.

The secondary battery module of the aircraft 2004 has eight 4 V secondary batteries connected in series, which has the maximum voltage of 32 V, for example. Providing the aircraft 2004 with the battery pack 2103 which has the secondary battery module and the charging control circuit electrically connected to the module improves safety.

At least part of this embodiment can be implemented in combination with any of the other embodiments described in this specification as appropriate.

REFERENCE NUMERALS

300: anomaly-monitoring unit, 301: battery, 301a: secondary battery, 301b: secondary battery, 301c: secondary battery, 302: battery controller, 303: motor controller, 304: motor, 305: gear, 306: DC-DC circuit, 307: electric power steering, 308: heater, 309: defogger, 310: DC-DC circuit, 311: battery, 312: inverter, 314: power window, 315: lights, 316: tire, 600: secondary battery, 602: emulator, 603: controller IC, 604: microcomputer, 605: display, 613: conductive plate, 614: conductive plate, 615: module, 801: arrangement x, 802: arrangement t, 803: former half of length of sequence, 804: predicted data length, 2001: automobile, 2002: transporter, 2003: transportation vehicle, 2004: aircraft, 2100: battery pack, 2101: battery pack, 2102: battery pack, 2103: battery pack

The invention claimed is:

1. A charging control device comprising:
a first secondary battery, a second secondary battery, and a third secondary battery connected in series;
an anomaly detection unit operationally connected to each of the first secondary battery, the second secondary battery, and the third secondary battery; and
a first switch between one terminal of the first secondary battery and one terminal of the second secondary battery,
wherein the anomaly detection unit is configured to learn a normal charging curve of each of the first secondary battery, the second secondary battery, and the third secondary battery and estimate a bit later charging curve on the basis of the normal charging curve by a neural network,
wherein the anomaly detection unit is configured to detect an anomaly by measuring a charging curve which diverges from the estimated bit later charging curve, and
wherein, when the second secondary battery has the anomaly, the anomaly detection unit is configured to connect the one terminal of the first secondary battery in series to the third secondary battery with the use of a wire bypassing the one terminal of the second secondary battery and through the action of switching of the first switch so that the second secondary battery is not charged.

2. The charging control device according to claim 1, wherein the first switch is a power MOSFET.

3. The charging control device according to claim 1, further comprising:
a second switch between the other terminal of the second secondary battery and one terminal of the third secondary battery,
wherein, when the third secondary battery has the anomaly, the anomaly detection unit is configured to bring the third secondary battery into an uncharged state with the use of a wire bypassing the one terminal of the third secondary battery and through the action of switching of the second switch.

4. A charging control device comprising:
a first secondary battery holder, a second secondary battery holder, and a third secondary battery holder connected in series;
an anomaly detection unit operationally connected to each of the first secondary battery holder, the second secondary battery holder, and the third secondary battery holder; and
a first switch between one terminal of the first secondary battery holder and one terminal of the second secondary battery holder,
wherein the anomaly detection unit is configured to learn a normal charging curve of each of the first secondary battery holder, the second secondary battery holder, and the third secondary battery holder and estimate a bit later charging curve on the basis of the normal charging curve by a neural network,
wherein the anomaly detection unit is configured to detect an anomaly by measuring a charging curve which diverges from the estimated bit later charging curve, and wherein, when the second secondary battery holder has the anomaly, the anomaly detection unit is configured to connect the one terminal of the first secondary battery holder in series to the third secondary battery holder with the use of a wire bypassing the one terminal of the second secondary battery holder and through the action of switching of the first switch so that electric power is not supplied to the second secondary battery holder.

5. The charging control device according to claim 1, wherein an LSTM is used for the neural network.

6. The charging control device according to claim 4, wherein an LSTM is used for the neural network.

\* \* \* \* \*